(12) United States Patent
Ahn et al.

(10) Patent No.: US 8,143,925 B2
(45) Date of Patent: Mar. 27, 2012

(54) DELAY LOCKED LOOP

(75) Inventors: Seung-Joon Ahn, Gyeonggi-do (KR); Jong-Chern Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 21 days.

(21) Appl. No.: 12/753,442

(22) Filed: Apr. 2, 2010

(65) Prior Publication Data

US 2011/0156766 A1 Jun. 30, 2011

(30) Foreign Application Priority Data

Dec. 29, 2009 (KR) .................. 10-2009-0132975

(51) Int. Cl.
*H03L 7/06* (2006.01)
(52) U.S. Cl. ....................... 327/158; 327/149
(58) Field of Classification Search ........... 327/149, 327/158
See application file for complete search history.

(56) References Cited

U.S. PATENT DOCUMENTS

| 3,811,253 A * | 5/1974 | Austin et al. ............. 96/111 |
| 2004/0212413 A1* | 10/2004 | Lee ........................ 327/158 |
| 2010/0213991 A1* | 8/2010 | Fukuda ..................... 327/117 |
| 2011/0074479 A1* | 3/2011 | Yun et al. .................. 327/158 |
| 2011/0133808 A1* | 6/2011 | Akamatsu .................. 327/276 |
| 2011/0156766 A1* | 6/2011 | Ahn et al. .................. 327/142 |
| 2011/0156767 A1* | 6/2011 | Ahn et al. .................. 327/142 |
| 2011/0182386 A1* | 7/2011 | Duello et al. ............. 375/344 |
| 2011/0187427 A1* | 8/2011 | Kim et al. .................. 327/158 |
| 2011/0205832 A1* | 8/2011 | Jeon ....................... 365/233.16 |

FOREIGN PATENT DOCUMENTS

KR 100792379 1/2008
KR 1020080003023 1/2008

OTHER PUBLICATIONS

Notice of Allowance issued by the Korean Intellectual Property Office on Nov. 30, 2011.

* cited by examiner

*Primary Examiner* — Lincoln Donovan
*Assistant Examiner* — Adam Houston
(74) *Attorney, Agent, or Firm* — IP & T Group LLP

(57) ABSTRACT

A delay locked loop includes a replica delay oscillator unit, a division unit, a pulse generation unit, a code value output unit, and a delay line. The replica delay oscillator unit generates a replica oscillation signal having a period corresponding to a replica delay. The division unit receives the replica oscillation signal and a clock signal and divides the replica oscillation signal and the clock signal at a first or second ratio in response to a delay locking detection signal. The pulse generation unit generates a delay pulse having a pulse width corresponding to a delay amount for causing a delay locking. The code value output unit adjusts a code value corresponding to the pulse width of the delay pulse in response to the delay locking detection signal. The delay line delays the clock signal in response to the code value.

12 Claims, 4 Drawing Sheets

DELAY LOCKED LOOP

CROSS-REFERENCE TO RELATED APPLICATIONS

The present application claims priority of Korean Patent Application No. 10-2009-0132975, filed on Dec. 29, 2009, which is incorporated herein by reference in its entirety.

BACKGROUND OF THE INVENTION

Exemplary embodiments of the present invention relate to an integrated circuit, and more particularly, to a delay locked loop of a semiconductor memory device.

Semiconductor memory devices have been continuously improved to increase their integration density and their operating speed. Synchronous memory devices designed to operate in synchronization with clocks provided from the outside of memory chips have been introduced to increase the operating speed of these memory devices. Such memory devices use a delay locked loop (DLL) to generate an internal clock by delaying an external clock for a predetermined time in order that data are outputted in exact synchronization with rising and falling edges of a clock.

A DLL generates an internal clock in which the delay element inside a dynamic random access memory (DRAM) is compensated with respect to an external clock, and this is called a delay locking. The delay locked state refers to a state in which a reference clock (REFCLK) and a feedback clock (FBCLK) are synchronized with each other. A typical DLL achieves the synchronization between a feedback clock (FBCLK) and a reference clock (REFCLK) by adjusting a delay amount.

FIG. 1 is a block diagram of a typical DLL having a closed loop structure.

Referring to FIG. 1, the DLL includes a buffering unit 100, a phase comparison unit 110, a delay control unit 120, a variable delay unit 130, and a delay model unit 140.

The buffering unit 100 is configured to buffer an external clock EXTCLK and transfer the buffered external clock EXTCLK to the inside of the DLL as a reference clock REFCLK. The phase comparison unit 110 is configured to compare a phase of the reference clock REFCLK with a phase of a feedback clock FBCLK, and the delay control unit 120 is configured to generate a delay control signal CTR in response to an output signal of the phase comparison unit 110. The variable delay unit 130 is configured to delay the reference clock REFCLK in response to the delay control signal CTR. The delay model unit 140 is configured to model a delay of an actual clock/data path to an output signal of the variable delay unit 130 and output the feedback signal FBCLK.

The feedback clock FBCLK is a clock in which a delay time of the variable control unit 130 and a delay time of the delay model unit 140 are added to the reference clock REFCLK. The DLL compares the reference clock REFCLK with the feedback clock FBCLK and outputs a desired DLL clock DLLCLK when the two clocks have minimum jitters, that is, a delay locking is achieved.

SUMMARY OF THE INVENTION

An exemplary embodiment of the present invention is directed to improve noise characteristics of a DLL by varying the time necessary for a delay locking of the DLL.

In accordance with an embodiment of the present invention, a delay locked loop includes a replica delay oscillator unit configured to generate a replica oscillation signal having a period corresponding to a replica delay, a division unit configured to receive the replica oscillation signal and a clock signal, divide the replica oscillation signal and the clock signal at a first division ratio or a second division ratio, and generate output signals in response to a delay locking detection signal, a pulse generation unit configured to receive the output signals of the division unit and generate a delay pulse having a pulse width corresponding to a delay amount for causing a delay locking; a code value output unit configured to adjust a code value corresponding to the pulse width of the delay pulse in response to a delay locking detection signal, and a delay line configured to delay the clock signal in response to the code value.

In accordance with another embodiment of the present invention, a delay locked loop includes a delay pulse generation unit configured to generate a delay pulse having a pulse width corresponding to a delay amount for causing a delay locking in response to a divided replica oscillation signal and a divided clock signal which are generated by dividing a replica oscillation signal and a clock signal at a predefined first division ratio or a second division ratio, a coding unit configured to code the pulse width of the delay pulse and output a code value, a code value adjustment unit configured to receive the code value, divide the code value at a rate of the first division ratio and the second division ratio in response to a to delay locking detection signal, and output an adjusted code value, and a delay line configured to delay the clock signal in response to the adjusted code value outputted from the code value adjustment unit.

The division unit may divide the replica oscillation signal and the clock signal while varying a division ratio in response to the delay locking detection signal, and output the divided replica oscillation signal and the divided clock signal to the pulse generation unit. The pulse generation unit may generate the delay pulse in response to the output signal of the division unit, and the coding unit may output the code value corresponding to the pulse width of the delay pulse. The code value adjustment unit may output the code value in response to the delay locking detection signal to thereby achieve the delay locking of the clock signal.

DESCRIPTION OF EXEMPLARY EMBODIMENTS

Figure 1:
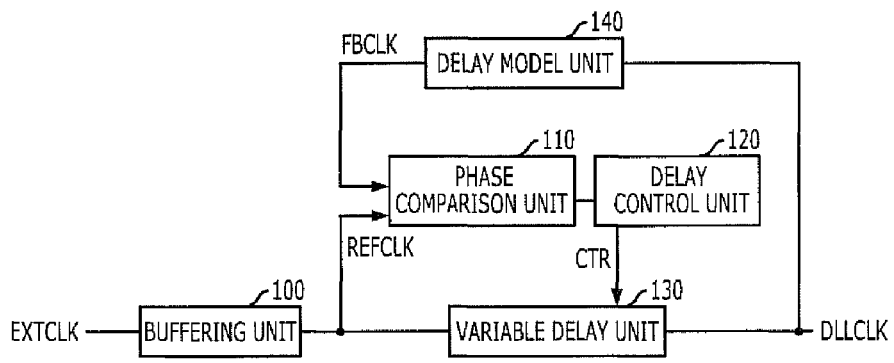
FIG. 1 is a block diagram of a typical DLL having a dosed loop structure.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully enable those having ordinary skill in the art to practice the invention without undue experimentation. Throughout the disclosure, like reference numerals refer to like parts throughout the various figures and embodiments of the present invention.

Figure 2:
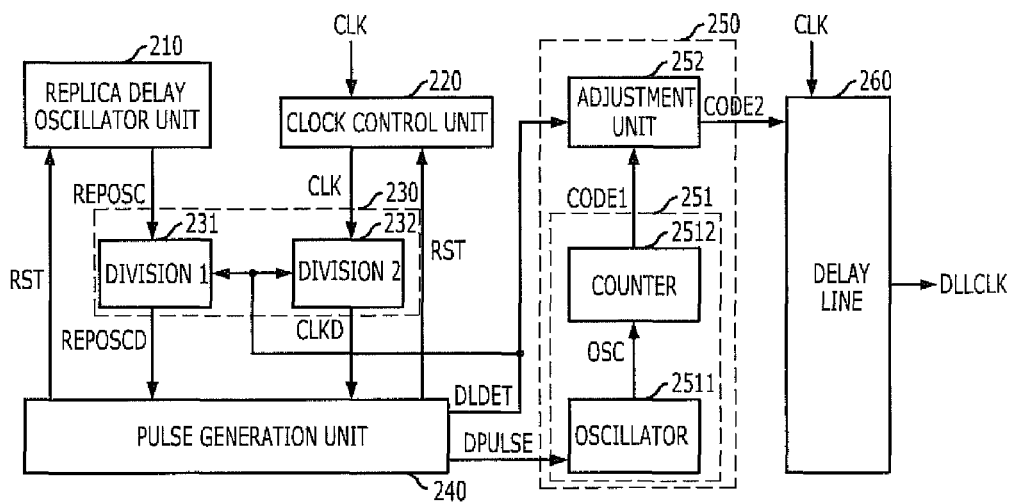
FIG. 2 is a block diagram of a DLL in accordance with an embodiment of the present invention.
Figure 3:
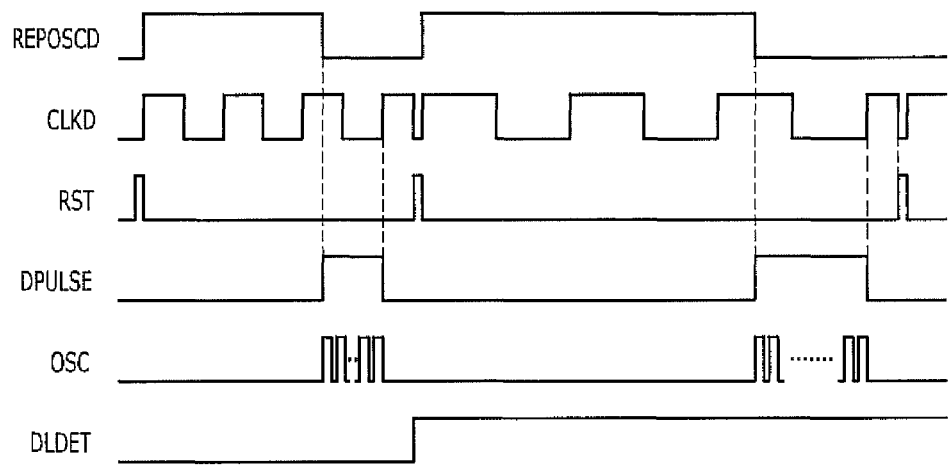
FIG. 3 is an operation timing diagram of the DLL in accordance with the embodiment of the present invention.

FIG. 2 is a block diagram of a DLL in accordance with an embodiment of the present invention, and FIG. 3 is an operation timing diagram of a DLL according to an embodiment of the present invention.

Referring to FIG. 2, the DLL includes a replica delay oscillator unit 210, a clock control unit 220, a division unit 230, a pulse generation unit 240, a code value output unit 250, and a delay line 260.

The operations of the respective elements will be described below with reference to FIG. 2, and the overall operation of the DLL in accordance with the embodiment of the present invention will be described below with reference to FIG. 3.

The replica delay oscillator unit 210 is configured to generate a replica oscillator signal REPOSC having a period corresponding to a replica delay (a delay which occurs in a clock signal output path), and output the replica oscillation signal REPOSC in response to a reset signal RST. The clock control unit 220 is configured to receive a clock signal CLK and output the received clock signal CLK in response to the reset signal RST. The replica delay oscillator unit 210 and the clock control unit 220 output the replica oscillation signal REPOSC and the clock signal CLK in synchronization with each other in response to the reset signal RST.

The division unit 230 is configured to divide the replica oscillation signal REPOSC and the clock signal CLK at a predefined division ratio in response to a delay locking detection signal DLDET. More specifically, the division unit 230 divides the replica oscillation signal REPOSC and the clock signal CLK at a predefined first division ratio in a deactivation period of the delay locking detection signal DLDET, and divides the replica oscillation signal REPOSC and the clock signal CLK at a second division ratio greater than the first division ratio in an activation period of the delay locking detection signal DLDET. The division unit 230 may be provided with a first division section 231 and a second division section 232. The first division section 231 divides the replica oscillation signal REPOSC at the first division ratio in the deactivation period of the delay locking detection signal DLDET, divides the replica oscillation signal REPOSC at the second division ratio in the activation period of the delay locking detection signal DLDET, and outputs a divided replica oscillation signal REPOSCD. The second division section 232 divides the clock signal CLK at the first division ratio in the deactivation period of the delay locking detection signal DLDET, divides the clock signal CLK at the second division ratio in the activation period of the delay locking detection signal DLDET, and outputs a clock signal CLKD. The delay locking detection signal DLDET refers to a signal which is activated through the first delay locking achieved after the operation of the DLL.

The pulse generation unit 240 is configured to receive the divided replica oscillation signal REPOSCD and the divided clock signal CLKD from the division unit 230, and generate a delay pulse DPULSE having a pulse width corresponding to a delay amount for causing the delay locking. In addition, the pulse generation unit 240 is configured to generate the reset signal RST, which resets the DLL, and the delay locking detection signal DLDET. The operation of the pulse generation unit 240 will be described in more detail with reference to FIGS. 4 and 5, which are a detailed block diagram and a detailed circuit diagram of the pulse generation unit 240, respectively.

The code value output unit 250 is configured to receive the delay pulse DPULSE, to code the delay amount necessary for the delay locking in response to the delay locking detection signal DLDET, and to output a code value. The code value output unit 250 may include a coding section 251 and a code value adjustment unit 252. The coding section 251 is configured to receive the delay pulse DPULSE, to detect the delay amount necessary for the delay locking, and to code the detected delay amount. The coding section 251 includes an oscillator 2511 and a counter 2512. The oscillator 2511 is configured to generate an oscillation signal OSC having a period corresponding to an integer multiple of a delay amount of a unit delay of the delay line 260. The period of the oscillation signal OSC corresponds to the first division ratio of the clock signal CLK. For example, the division unit 230 divides the replica oscillation signal REPOSC and the clock signal CLK at the first division ratio and outputs the divided replica oscillation signal REPOSCD and the divided clock signal CLKD to the pulse generation unit 240. At this time, assuming that the division ratio is 32, the generated oscillation signal OSC will have a single cycle which corresponds to 32 times the delay amount of the unit delay of the delay line 260. The counter 2512 is configured to count the number of periods of the oscillation signal OSC included in the pulse width (logic high level duration) of the delay pulse DPULSE, to code the count value, and to output a code value CODE1.

The code value adjustment unit 252 is configured to receive the output signal (i.e., code value CODE1) of the counter 2512, and (1) to output the output signal of the counter 2512 to the delay line 260 in the deactivation period of the delay locking detection signal DLDET, or (2) to divide the code value CODE1 outputted from the counter 2512 according to the rate of the first division ratio in the deactivation period or the second division ratio in the activation period of the delay locking detection signal DLDET, and to output the resulting value to the delay line 260. For example, assuming that the first division ratio is 32 and the second division ratio is 64, since the second division ratio is two times the first division ratio, the pulse width of the delay pulse DPULSE generated from the pulse generation unit 240 becomes two times larger in comparison with the case in which the signal is divided at the first division ratio. Therefore, in this case, the code value adjustment unit 252 divides the code value CODE1 received from the counter 2512 by 2, and outputs a code value CODE2 to the delay line 260. The code value adjustment unit 252 may be implemented with a shift register (not shown). When the code value adjustment unit 252 is implemented with a shift register, the result obtained by dividing the code value CODE1 by 2 is produced at each right shift. When the clock signal CLK is divided, the pulse width of the delay pulse DPULSE also increases in correspondence to the division ratio. Hence, the code value adjustment unit 252 adjusts the code value CODE1 in correspondence to the division ratio, and therefore codes the delay amount necessary for the delay locking by using only one oscillator 2511.

The delay line 260 is configured to receive the code value, either CODE1 (not shown) or CODE2, from the code value adjustment unit 252, and delays the clock signal CLK in response to the code value CODE2. In this way, the delay locking of the clock signal CLK is achieved.

The overall operation of the DLL in accordance with an exemplary embodiment of the present invention will be described below with reference to FIG. 3.

First, the DLL begins to operate at the same time with the activation of the reset signal RST. When the reset signal RST is activated, the rising edges of the replica oscillation signal REPOSC and the clock signal CLK are synchronized with each other in the deactivation period of the reset signal RST, and REPOSC and CLK are outputted, respectively, from the replica delay oscillator unit 210 and the clock control unit 220. The pulse generation unit 240 generates the delay pulse DPULSE in response to the divided replica oscillation signal REPOSCD and the divided clock signal CLKD. The pulse width of the delay pulse DPULSE corresponds to the delay amount which is used for the delay locking. The delay amount for causing the delay locking is equal to (n*(tCK−REPD)), where n is an integer greater than zero, tCK is one cycle of the clock signal CLK, and REPD is a replica delay which is the delay length caused by the replica delay oscillator unit 210. The coding section 251 receives the delay pulse DPULSE, counts the number of oscillations of the oscillation signal OSC during the high pulse duration of the delay pulse DPULSE, and converts the counted number of oscillations into the code value CODE1. At this time, during the deactivation period of the delay locking detection signal DLDET, the division unit 230 divides the replica oscillation signal REPOSC and the clock signal CLK at the predefined first division ratio, and the code value adjustment unit 252 outputs to the delay line 260 the code value CODE1 (not shown), which is the output of the coding section 251. On the other hand, during the activation period of the delay locking detection signal DLDET, the division unit 230 divides the replica oscillation signal REPOSC and the clock signal CLK at the second division ratio greater than the first division ratio, and the code value adjustment unit 252 adjusts the code value CODE1, which is the output of the coding section 251, according to the rate of the first division ratio and the second division ratio, and outputs the code value CODE2 to the delay line 260.

Figure 4:
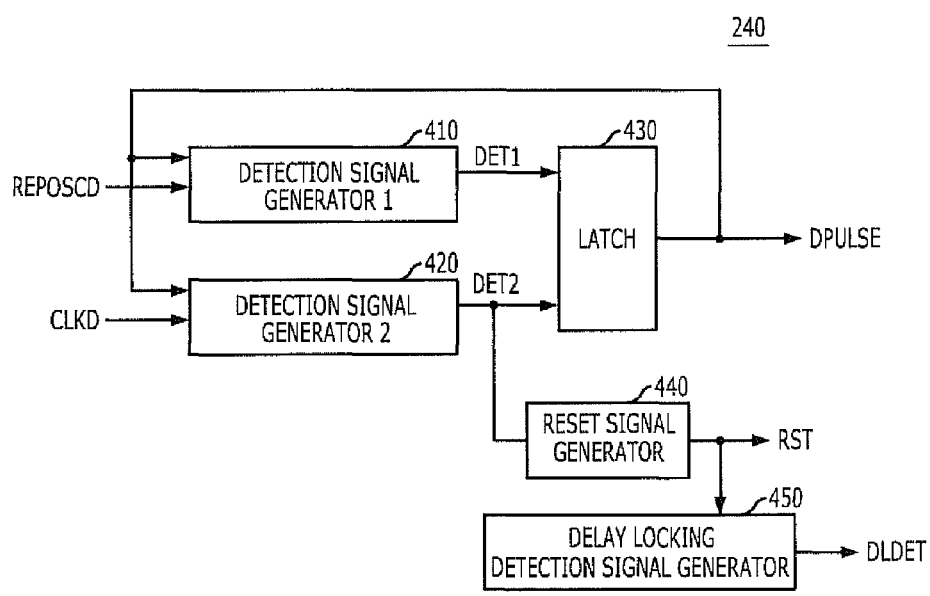
FIG. 4 illustrates an implementation example of a pulse generation unit of FIG. 2.
Figure 6:
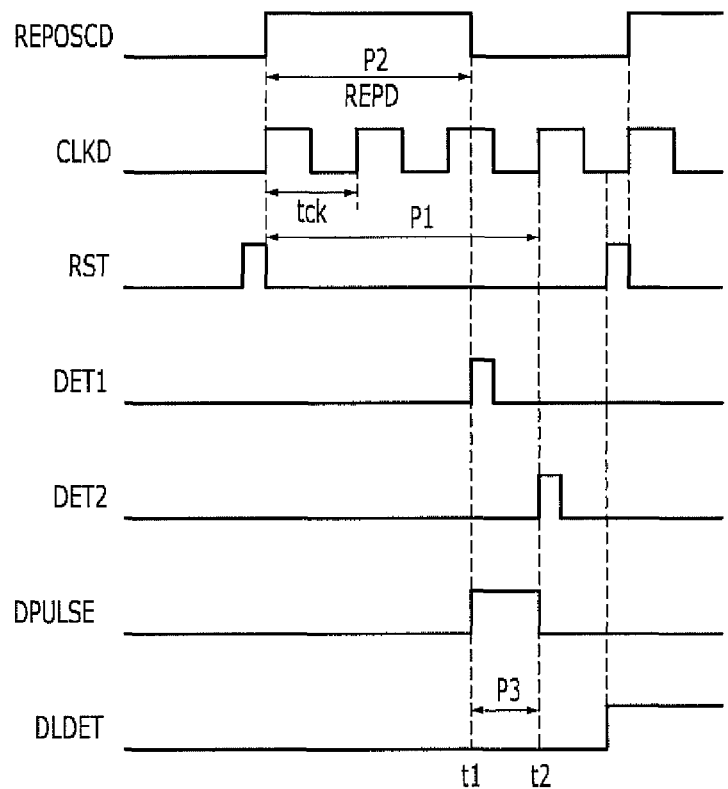
FIG. 6 is an operation timing diagram of the implementation example of the pulse generation unit of FIG. 2.

FIG. 4 illustrates an implementation example of the pulse generation unit 240 of FIG. 2, and FIG. 6 is an operation timing diagram of the implementation example of the pulse generation unit 240.

Referring to FIG. 4, the pulse generation unit 240 includes a first detection signal generator 410, a second detection signal generator 420, a latch 430, a reset signal generator 440, and a delay locking detection signal generator 450.

The operation of the pulse generation unit 240 will be described below with reference to FIGS. 4 and 6.

A case in which the first division ratio of the division unit 230 is 1 will be described as an example. In this case, the output of the division unit 230 is identical to the replica oscillation signal REPOSC and the clock signal CLK.

The duration of the high pulse of the divided replica oscillation signal REPOSCD is determined from the replica delay amount REPD caused by the replica delay oscillator unit 210. In this case, the delay amount for causing the delay locking is equal to (n*(tCK−REPD)), where n is an integer greater than zero. The DLL begins to operate when the reset signal RST is applied.

The first detection signal generator 410 generates a first detection signal DET1 which is activated in synchronization with the falling edge of the divided replica oscillation signal REPOSCD, and the second detection signal generator 420 generates a second detection signal DET2 which is activated in synchronization with the rising edge of the clock signal CLK after the generation of the first detection signal DET1.

The latch 430 receives the first detection signal DET1 and the second detection signal DET2 and generates the delay pulse DPULSE which is activated at the activation timing of the first detection signal DET1 and deactivated at the activation timing of the second detection signal DET2. The latch 430 may be implemented with an RS flip-flop (not shown). In this case, the delay pulse DPULSE may be generated by inputting the first detection signal DET1 and the second detection signal DET2 as SET and RESET, respectively.

The delay pulse DPULSE has a logic high state during a third period P3 defined by a difference between a first period P1, which corresponds to an integer multiple of the clock signal CLK, and a second period P2, which is a predefined replica delay period REPD.

The reset signal generator 440 receives and delays the second detection signal DET2 by a predetermined time, and outputs the reset signal RST. The delay amount for delaying the second detection signal DET2 in the reset signal generator 440 is equal to or greater than the time taken until the delay line 260 delays the clock signal CLK in response to the code value CODE2 after the generation of the second detection signal DET2.

The delay locking detection signal generator 450 generates the delay locking detection signal DLDET which is activated until the DLL performs a new operation after the activation timing of the reset signal RST generated during or after a previous operation of the DLL. The operation characteristics of the division unit 230 and the code value adjustment unit 252 are different from each other during the activation period of the delay locking detection signal DLDET.

Figure 5:
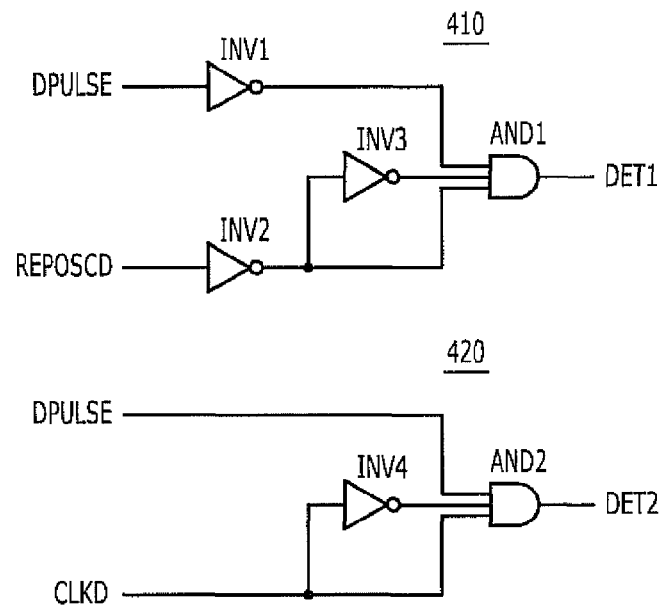
FIG. 5 is a circuit diagram illustrating implementation examples of a first detection signal generator and a second detection signal generator of FIG. 4.

FIG. 5 is a circuit diagram illustrating an exemplary implementation of the first detection signal generator 410 and the second detection signal generator 420 of FIG. 4.

The first detection signal generator 410 includes a first inverter INV1 configured to invert the delay pulse DPULSE, a second inverter INV2 configured to invert the divided replica oscillation signal REPOSCD, a third inverter INV3 configured to invert an output signal of the second inverter INV2, and a first AND gate AND1 configured to perform an AND operation on output signals of the first to third inverters INV1, INV2 and INV3, and output the first detection signal DET1.

The second detection signal generator 420 includes a fourth inverter INV4 configured to invert the divided clock signal CLKD, and a second AND gate AND2 configured to perform an AND operation on the delay pulse DPULSE, the divided clock signal CLKD, and an output signal of the fourth inverter INV4, and output the second detection signal DET2.

The operations of the first detection signal generator 410 and the second detection signal generator 420 will be described below with reference to FIGS. 5 and 6.

First, the operation of the first detection signal generator 410 will be described.

When the divided replica oscillation signal REPOSCD changes to a logic high level due to the reset signal RST, a logic low signal is applied to the first AND gate AND1 by the second inverter INV2, and the first detection signal DET1 having a logic low level is outputted. The delay pulse DPULSE maintains a logic low level until time t1 at which the divided replica oscillation signal REPOSCD changes from a logic high level to a logic low level. This is because the delay pulse DPULSE is a signal which is activated after the first detection signal DET1 changes to a logic high level. Therefore, the logic high signal outputted through the first inverter INV1 is applied to the first AND gate AND1 until time U. Due to the delay caused by the third inverter INV3 from time t1 at which the divided replica oscillation signal REPOSCD changes from a logic high level to a logic low level, the logic high signal is applied to the first AND gate AND1 for the delay time of the third inverter INV3. Therefore, the first detection signal DET1 has a logic high level because logic high signals are applied to all input terminals of the first AND gate AND1 for the delay time of the third inverter INV3 from time t1 at which the divided replica oscillation signal REPOSCD changes from a logic high level to a logic low level. After the elapse of the delay time caused by the third inverter INV3, the first detection signal DET1 has a logic low level because a second input terminal of the first AND gate AND1 (to which the output signal of the second inverter INV2 is inputted) and a third input terminal of the first AND gate AND1 (to which the output signal of the third inverter INV3 is inputted) have different logic levels.

Next, the operation of the second detection signal generator 420 will be described.

After the generation of the reset signal RST, the delay pulse DPULSE maintains a logic low level until the first detection signal DET1 is activated. Thus, the second AND gate AND2 receiving the delay pulse DPULSE outputs the second detection signal DET2 having a logic low level. The second detection signal DET2 maintains a logic low level during a period t3, that is, from time t1 at which the first detection signal DET1 becomes a logic high level to time t2 at which the clock signal CLK changes from a logic low level to a logic high level. The second detection signal DET2 maintains a logic high level for a delay time of the fourth inverter INV4 from time t2 at which the divided clock signal CLKD changes from a logic low level to a logic high level and then becomes a logic low level.

The configuration and operation of the DLL in accordance with an exemplary embodiment of the present invention has been described above.

Figure 7:
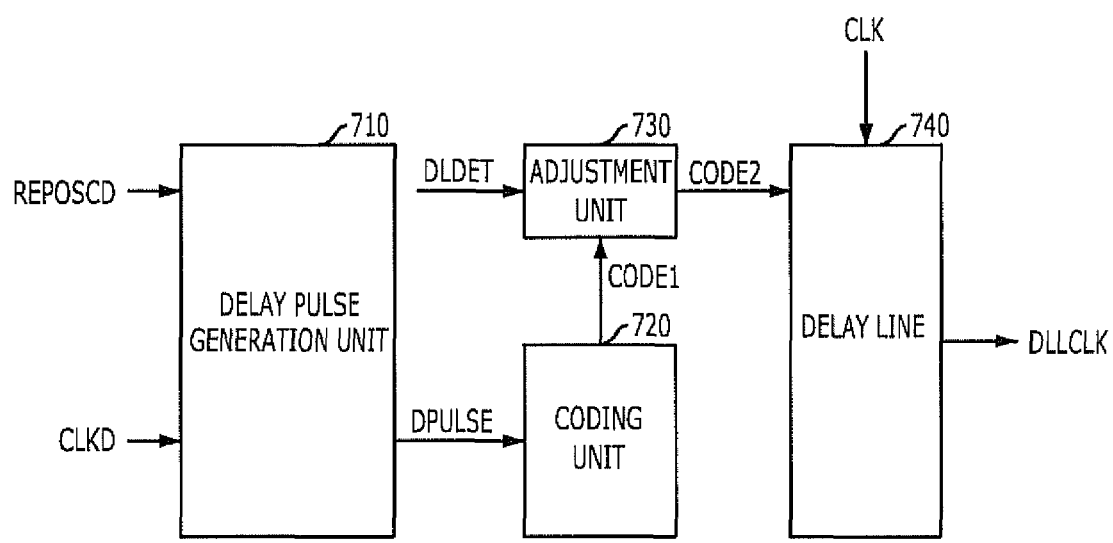
FIG. 7 is a block diagram of a DLL in accordance with another embodiment of the present invention.

FIG. 7 is a block diagram of a DLL in accordance with another exemplary embodiment of the present invention.

Referring to FIG. 7, the DLL in accordance with another embodiment of the present invention includes a delay pulse generation unit 710, a coding unit 720, a code value adjustment unit 730, and a delay line 740.

The delay pulse generation unit 710 is configured to generate a delay pulse DPULSE having a pulse width corresponding to a delay amount for causing a delay locking in response to a divided replica oscillation signal REPOSCD and a divided clock signal CLKD which are generated by dividing a replica oscillation signal REPOSC and a clock signal CLK at a predefined first division ratio or a second division ratio.

The coding unit 720 is configured to measure the magnitude of the delay pulse DPULSE, to code the delay amount for causing the delay locking, and to output a code value CODE1.

The code value adjustment unit 730 is configured to receive the code value CODE1 from the coding unit 720, divide the code value CODE1 at a rate of the first division ratio and the second division ratio in response to a delay locking detection signal DLDET, and output a code value CODE2 to the delay line 740.

The configuration and operation of the coding unit 720 and the code value adjustment unit 730 are similar or substantially identical to those of the coding section 251 and the code value adjustment unit 252 in the previous embodiment.

The delay line 740 is configured to delay the clock signal CLK in response to the code value CODE2 and output a DLL clock DLLCLK.

In the exemplary embodiments set forth above, the second division ratio must be greater than the first division ratio, but the first division ratio may be 1. In this case, the replica oscillation signal REPOSC and the clock signal CLK are inputted to the pulse generation unit 240 in such a state that they are not divided. Since the first division ratio has a predefined value, the DLL may be designed by adjusting the period of the oscillation signal OSC of the oscillator 2511 according to the first division ratio.

When the delay locking is performed through the division operation, the delay locking time increases. Therefore, the first division ratio should be determined within the range which does not exceed DLL locking time (tDLLK) which is required in the specification. For example, in the case of DDR3, tDLLK in the specification is 512 tCK (tCK: one cycle of the clock signal), that is, the delay locking should be achieved within 512 cycles of the clock signal CLK. The first division ratio should be adjusted to meet the above requirement. On the other hand, since the second division ratio has no relation to tDLLK characteristic, there is no special limitation on the second division ratio. However, the second division ratio should be determined considering several possibilities which may be caused by the division operation.

In accordance with the exemplary embodiments of the present invention, the variable use of the time necessary for the delay locking makes it possible to meet tDLLK and to make the DLL robust against noise.

While the present invention has been described with respect to the exemplary embodiments, it will be apparent to those skilled in the art that various changes and modifications may be made without departing from the spirit and scope of the invention as defined in the following claims and their equivalents.

What is claimed is:

1. A delay locked loop, comprising:
    a replica delay oscillator unit configured to generate a replica oscillation signal having a period corresponding to a replica delay;
    a division unit configured to receive the replica oscillation signal and a clock signal, divide the replica oscillation signal and the clock signal at a first division ratio or a second division ratio, and generate output signals in response to a delay locking detection signal;
    a pulse generation unit configured to receive the output signals of the division unit and generate a delay pulse having a pulse width corresponding to a delay amount for causing a delay locking;
    a code value output unit configured to adjust a code value corresponding to the pulse width of the delay pulse in response to the delay locking detection signal; and
    a delay line configured to delay the clock signal in response to the code value.

2. The delay locked loop of claim 1, wherein the code value output unit comprises:
    a coding section configured to output the code value corresponding to the delay pulse as an output signal; and
    a code value adjustment unit configured to receive the output signal of the coding section, divide the output signal of the coding section by a value corresponding to a rate of the first division ratio or the second division ratio in response to the delay locking detection signal, and output a resulting signal to the delay line.

3. The delay locked loop of claim 2, wherein the coding section comprises:
    an oscillator configured to generate an oscillation signal having a period corresponding to an integer multiple of a delay length of a unit delay of the delay line; and
    a counter configured to count a number of oscillations of the oscillation signal during a duration of a high pulse of the delay pulse in response to the delay pulse and the oscillation signal, and to code the counted number of oscillations.

4. The delay locked loop of claim 3, wherein the oscillation signal has a period corresponding to the first division ratio.

5. The delay locked loop of claim 1, wherein the division unit is configured to divide the replica oscillation signal and the clock signal at the first division ratio when the delay locking detection signal is in a deactivated state, and configured to divide the replica oscillation signal and the clock signal at the second division ratio when the delay locking detection signal is in an activated state, and the delay locking detection signal is activated when a delay locking of the clock signal is achieved during an operation of the DLL.

6. The delay locked loop of claim 1, wherein the division unit comprises:
    a first division section configured to divide the replica oscillation signal at the first division ratio when the delay locking detection signal is in a deactivated state, and configured to divide the replica oscillation signal at the second division ratio when the delay locking detection signal is in an activated state; and
    a second division section configured to divide the clock signal at the first division ratio when the delay locking detection signal is in a deactivated state, and configured to divide the clock signal at the second division ratio when the delay locking detection signal is in an activated state,
    wherein the delay locking detection signal is activated when a delay locking of the clock signal is achieved during an operation of the DLL.

7. The delay locked loop of claim 5, wherein the second division ratio is greater than the first division ratio.

8. The delay locked loop of claim 1, wherein the pulse generation unit comprises:
    a first detection signal generator configured to detect an edge of the replica oscillation signal corresponding to a rising edge of the delay pulse, and output a first detection signal;
    a second detection signal generator configured to detect an edge of the clock signal corresponding to a falling edge of the delay pulse, and output a second detection signal;
    a latch configured to generate the delay pulse in response to the first detection signal and the second detection signal;
    a reset signal generator configured to delay the second detection signal for a predetermined time, and generate a reset signal; and
    a delay locking detection signal generator configured to output the delay locking detection signal which is activated at an activation timing of the reset signal.

9. The delay locked loop of claim 8, wherein the first detection signal generator comprises:
    a first inverter configured to invert the delay pulse;
    a second inverter configured to invert the replica oscillation signal;
    a third inverter configured to invert an output signal of the second inverter; and
    a first AND gate configured to perform an AND operation on output signals of the first to third inverters, and output the first detection signal.

10. The delay locked loop of claim 8, wherein the second detection signal generator comprises:
    a fourth inverter configured to invert the divided clock signal; and
    a second AND gate configured to perform an AND operation on the delay pulse, the divided clock signal, and an output signal of the fourth inverter, and output the second detection signal.

11. The delay locked loop of claim 8, wherein a delay time of the reset signal generator is greater than a time taken until the clock signal is delayed through a delay line after the generation of the second detection signal.

12. The delay locked loop of claim 8, wherein the latch is configured to generate the delay pulse which is activated in response to the first detection signal and deactivated in response to the second detection signal.

* * * * *